(12) United States Patent
Schenk

(10) Patent No.: US 8,963,632 B2
(45) Date of Patent: Feb. 24, 2015

(54) HIGH-FREQUENCY POWER AMPLIFIER WITH DOHERTY EXTENSION

(75) Inventor: Lothar Schenk, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 70 days.

(21) Appl. No.: 13/814,207

(22) PCT Filed: Aug. 3, 2011

(86) PCT No.: PCT/EP2011/063356
§ 371 (c)(1),
(2), (4) Date: Feb. 4, 2013

(87) PCT Pub. No.: WO2012/019949
PCT Pub. Date: Feb. 16, 2012

(65) Prior Publication Data
US 2013/0135044 A1    May 30, 2013

(30) Foreign Application Priority Data
Aug. 12, 2010 (DE) .......................... 10 2010 034 067

(51) Int. Cl.
*H03F 1/02* (2006.01)
*H03F 1/42* (2006.01)
(Continued)

(52) U.S. Cl.
CPC ............ *H03F 1/0288* (2013.01); *H03F 1/0261* (2013.01); *H03F 1/42* (2013.01); *H03F 1/56* (2013.01); *H03F 3/602* (2013.01); *H03F 2200/192* (2013.01); *H03F 2200/198* (2013.01); *H03F 2200/204* (2013.01); *H03F 2200/222* (2013.01); *H03F 2200/36* (2013.01); *H03F 2200/387* (2013.01); *H03F 2200/414* (2013.01); *H03F 2200/417* (2013.01); *H03F 2200/423* (2013.01); *H03F 2200/543* (2013.01)
USPC ........................................ 330/124 R; 330/295

(58) Field of Classification Search
USPC .......................... 330/295, 124 R, 53, 84, 286
See application file for complete search history.

(56) References Cited

U.S. PATENT DOCUMENTS
7,518,448 B1    4/2009 Blair
(Continued)

FOREIGN PATENT DOCUMENTS
EP    1887686 A1    2/2008
WO    2005031967 A1    4/2005

OTHER PUBLICATIONS

International Preliminary Report on Patentability and Written Opinion, mailed Feb. 12, 2013, issued in corresponding International Application No. PCT/EP2011/063356, filed Aug. 3, 2011, 9 pages.
(Continued)

*Primary Examiner* — Hieu Nguyen
(74) *Attorney, Agent, or Firm* — Christensen O'Connor Johnson Kindness PLLC

(57) ABSTRACT

A high-frequency power amplifier comprises a broadband amplifier (30), a Doherty extension (31) and a coupling device (33). In this context, the broadband amplifier (30) provides a power splitter (34), a main amplifier path (64) and an auxiliary amplifier path (65). The Doherty extension (32) provides a first offset line (60), a second offset line (61) and an impedance inverter (62). The broadband amplifier (30) amplifies an input signal and supplies the amplified signal to the Doherty extension (31) or to the coupling device (33).

11 Claims, 2 Drawing Sheets

(51) Int. Cl.
*H03F 1/56* (2006.01)
*H03F 3/60* (2006.01)

(56) References Cited

U.S. PATENT DOCUMENTS

| | | |
|---|---|---|
| 7,688,135 B2 | 3/2010 | Kim |
| 8,274,332 B2 * | 9/2012 | Cho et al. ............. 330/295 |
| 2007/0008032 A1 | 1/2007 | Kyu |
| 2010/0176885 A1 | 7/2010 | Kim |

OTHER PUBLICATIONS

Dettmann, I., "Effiziente Leistungsverstärkerarchitekturen für Mobilfunkbasisstationen," dissertation published Nov. 6, 2009, http://elib.uni-stuttgart.de/opus/volltexte/2009/4712/ (English abstract).

Lehmann, T. and Knoechel, R., "Design and Performance of Sequential Power Amplifiers," Microwave Symposium Digest, 2008 IEEE MTT-S International, 767-770, Jun. 2008.

International Search Report mailed Oct. 17, 2011, issued in corresponding International Application No. PCT/EP2011/063356, filed Aug. 3, 2011, 6 pages.

\* cited by examiner

HIGH-FREQUENCY POWER AMPLIFIER WITH DOHERTY EXTENSION

The invention relates to a high-frequency power amplifier, especially a high-power amplifier capable of being operated as a Doherty amplifier.

Conventionally, high-frequency power amplifiers are often operated in the AB-operating mode; that is, for example, by means of series connected diodes, a basis bias is generated, which the respective transistors render conductive even at very small levels. In the AB-operating mode, small signals are amplified as in the A-operating mode, and large signals are amplified as in the B-operating mode. Such amplifiers operate with particularly low distortion, but with poor efficiency.

Moreover, Doherty amplifiers are known to improve efficiency. In mobile radio technology, especially in the case of modulation methods with non-constant envelopes and a high Crest factor (for example, COFDM-signals), high-frequency amplifiers based on the Doherty principle have become more widespread in recent years. For example, U.S. Pat. No. 7,688,135 B2 shows a Doherty amplifier of this kind. However, with such amplifiers, it is disadvantageous that they provide only a very small bandwidth.

The invention is based on the object of providing a high-power amplifier, with which a high degree of efficiency can be achieved and which can be used over a broad frequency range.

This object is achieved for the device by the features of the independent claim 1. Advantageous further developments form the subject matter of the dependent claims relating back to this claim.

A high-frequency power amplifier according to the invention therefore comprises a broadband amplifier and a Doherty extension. The broadband amplifier in this context provides a power splitter, a main amplifier path and an auxiliary amplifier path. The Doherty extension provides at least one first offset line, a second offset line and an impedance inverter. The broadband amplifier amplifies an input signal and supplies the amplified signal to the Doherty extension or to a further processing device.

The high-frequency power amplifier according to the invention is particularly suitable for use in large, modular, semiconductor radio-transmitter terminal devices for amplitude-modulated signals (for example, COFDM-signals). It offers the possibility of using the amplifier principle according to Doherty while largely avoiding the disadvantages of the prior art. The broadband amplifier, which can comprise several amplifier modules, covers a broad frequency range (for example, UHF-band IV-V 470-862 MHz) with a broad bandwidth and without balancing. Together, the broadband amplifier and the Doherty extension form a Doherty amplifier. In this context, the Doherty extension contains the bandwidth-limiting components unique to the Doherty principle: a (tuneable) impedance inverter and one or two (tuneable) offset lines and a broadband impedance transformer. Accordingly, the limiting of the bandwidth is separated from the broadband amplifier. If required, it is possible to adjust a new frequency in a relatively short time through a simple mechanical re-tuning of the impedance transformation lines and offset lines.

In the following section, the invention is described by way of example on the basis of the drawings, in which an advantageous exemplary embodiment of the invention is illustrated. The drawings are as follows.

The structure and functioning of a conventional Doherty amplifier is first explained with reference to FIG. 1, and the problems which the present invention addresses are presented on this basis. The structure and functioning of an exemplary embodiment of the device according to the invention is then described with reference to FIG. 2. In some cases the presentation and description of identical elements in similar drawings has not been repeated.

Figure 1:
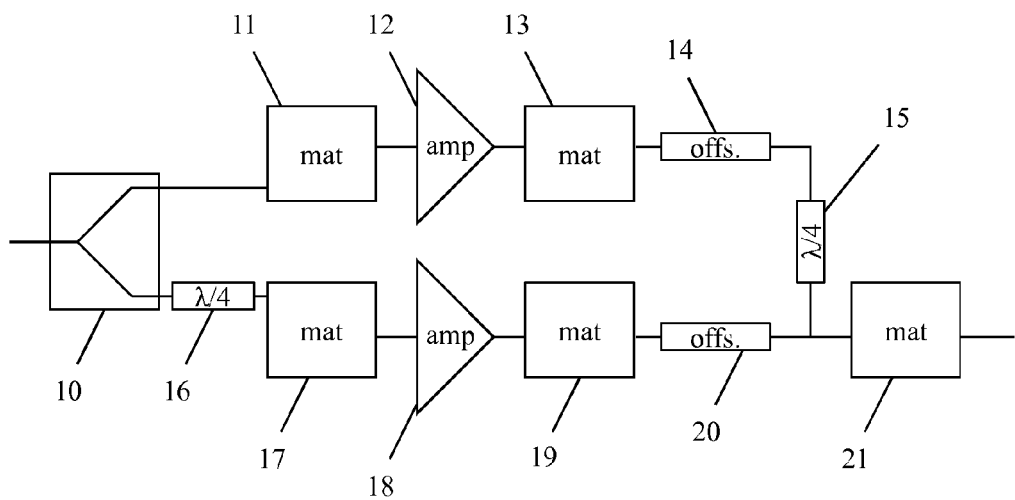
FIG. 1 shows an exemplary high-frequency power amplifier.

FIG. 1 shows an exemplary Doherty amplifier. A signal input is connected to a power splitter 10. A first output of the power splitter 10 is connected to a matching network 11. The matching network 11 is connected to a main transistor 12. This is connected to a further matching network 13. The matching network 13 is connected to an offset line 14. This is connected to an impedance inverter 15. The second input of the power splitter 10 is connected to a phase shifter 16. This is connected to a third matching network 17. In this context, the power splitter 10 causes no phase rotation. The input signal is distributed in equal portions between its two output paths. The matching network 17 is connected to an auxiliary transistor 18. This is connected to a fourth matching network 19, which is connected to a second offset line 20. The offset line 20 and the impedance inverter 15 are connected to a fifth matching network 21. The fifth matching network 21 matches the impedance of the Doherty amplifier to the impedance required by the subsequent system components.

The main transistor 12, which is operated in the AB-operating mode, operates at an increased load impedance with small input signals so that, from a relatively low level, for example, 6 dB below the 1 dB compression point, it already approaches saturation and accordingly operates with a maximum efficiency. Above the level threshold specified by the saturation level in the main transistor 12, the auxiliary transistor 18 operates in the C-operating mode. Through its output signal, it reduces the load impedance of the main transistor 12. Accordingly, with full control, the load impedance of the main transistor is reduced by the ratio between the level threshold and 1 dB compression point, and the main transistor 12 outputs the correspondingly higher power. In the −6 dB example, half the impedance leads to double the power.

Above the level threshold, the main transistor 12 therefore outputs an increasing output power in spite of the saturation, and therefore always operates with maximum efficiency. During the operating phases of the auxiliary transistor 18, efficiency is reduced only by its power consumption, but remains considerably higher by comparison with a conventional AB-amplifier. With full control of the auxiliary transistor 18 at the signal peaks, both of the transistors 12, 18 each supply half of the output power of the system.

The dynamic reduction of the load impedance of the main transistor 12 occurs as follows: both transistors 12, 18 operate at the same load impedance, in the case of the 6 dB threshold, at half of the system surge impedance, conventionally 25 ohms, wherein the auxiliary transistor 18 is connected directly to the load and the main transistor 12 is connected via an impedance inverter 15. At low levels, the auxiliary transistor 18 does not operate. Its output is high ohmic and therefore does not generate interference. The transistor capacity is tuned by a matching network 18 and an offset line 20. The main transistor 12 operates on the load increased by the impedance inverter 15. That is, the impedance inverter has a surge impedance of 50 ohms; and accordingly, a load of 100 ohms is obtained below the operating threshold of the auxiliary transistor 18. The output current of the auxiliary transistor 18 superimposed on the current of the main transistor 12 at the load impedance above the level threshold reduces the effective load impedance of the main transistor 12 via the impedance inverter 15. At the same time, the load impedance of the auxiliary transistor 18 declines correspondingly (ideally from a no-load state), so that it begins to supply a portion of the output power.

A line dimensioned to one quarter of the operating wavelength is conventionally used as the impedance inverter 15. The delay occurring as a result in the branch of the main transistor 12 is compensated at the input of the auxiliary transistor 18. In this exemplary embodiment, this is also implemented by means of a λ/4 line used as a phase shifter. A 90°-power splitter can be used as an alternative.

Two offset lines 14, 20 are conventionally provided to ensure that the output impedances of the main transistor 12 and the auxiliary transistor 18 after the matching networks 13 and respectively 19 are real and high ohmic. The matching networks 14 and respectively 19 can therefore be freely dimensioned. Conversely, in the case of the main transistor 12, the offset line 14 also ensures that, at the operating frequency, the dynamic change in impedance at the input of the impedance inverter 15, viewed from the main transistor, is transformed in real terms at the drain; in the 6 dB example from 100 ohms to 50 ohms.

The main disadvantage of the Doherty amplifiers is that the λ/4 lines required as the phase shifter 15 and the impedance inverter 16, and the offset lines 14, 20 operate accurately only at one frequency. As a result, the bandwidth is limited to a maximum of +/−10% of the dimensioned frequency. The variant formation required to cover larger bandwidths has meant that the use of the Doherty principle has hitherto not seemed meaningful especially in the TV broadcast ranges.

Figure 2:
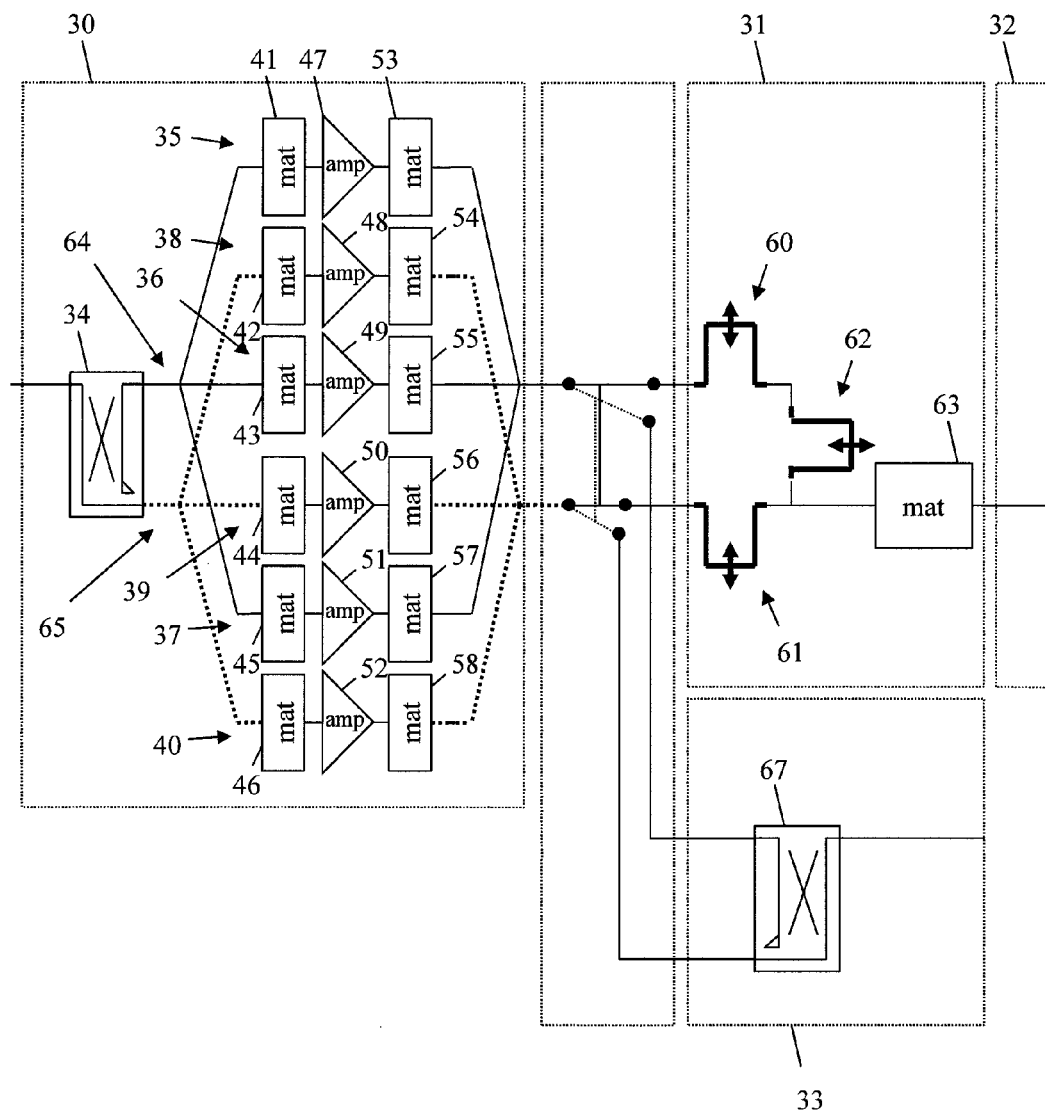
FIG. 2 shows an exemplary embodiment of the high-frequency power amplifier according to the invention.

FIG. 2 shows an exemplary embodiment of the amplifier according to the invention. The high-frequency power amplifier comprises a broadband amplifier 30, a Doherty extension 31 and, optionally, a coupling device 33. In this context, the broadband amplifier 30 contains a 90°-coupler 34, which splits an input signal in each case by 50% between two coupling paths. As shown in FIG. 1, a 0°-power splitter and a phase shifter can be used as an alternative. However, this significantly limits the bandwidth.

A first coupling path of the coupler 34 is connected to a main amplifier path 64. The second coupling path of the coupler 34 is connected to an auxiliary amplifier path 65. The main amplifier path 64 and the auxiliary amplifier path 65 here are each split between several amplifier paths 35, 36, 37, 38, 39, 40 with a 0°-phase displacement by power splitters which are not illustrated here.

In this exemplary embodiment, the main amplifier path 64 contains three amplifier paths 35, 36 and 37, while the auxiliary amplifier path 65 also contains three amplifier paths 38, 39 and 40. Each amplifier path 35-40 here contains a matching network 41-46, an amplifier transistor 47-52 and a second matching network 53-58. Each individual amplifier path 35, 36, 37 of the main amplifier path 64 here fulfils the function of the matching networks 11, 13 and of the main transistor 12 from FIG. 1. Each amplifier path 38, 39, 40 of the auxiliary amplifier path 65 here fulfils the function of the matching networks 17, 19 and of the auxiliary transistor 18 from FIG. 1. The output signals of the amplifier paths 35-40, separated into the main amplifier path 64 and auxiliary amplifier path 65, are recombined by the power combiner, which is also not illustrated here. That is, the output signals of the amplifier paths 35, 36, 37 are combined, while the output signals of the amplifier paths 38, 39, 40 are combined.

By way of difference from the exemplary embodiment shown here, different numbers of amplifier paths can also be used. Accordingly, even a use of only one amplifier path in the main amplifier path 64 and respectively in the auxiliary amplifier path 65 is also possible. A use of different numbers of amplifier paths in the main amplifier path 64 and in the auxiliary amplifier path 65 is also possible. For example, for signals which provide only a small amplitude difference between minimum and maximum amplitude, a larger number of amplifier paths can be provided in the main amplifier path 64. Conversely, for signals, which provide a very large difference between the minimum and maximum amplitude, a relatively large number of amplifier paths in the auxiliary amplifier path 65 can be provided.

The combined signals of the main amplifier path 64 and the auxiliary amplifier path 65 are then supplied to the Doherty extension 31. In this context, the signal of the main amplifier path 64 is supplied to a first offset line 60, while the signals of the auxiliary amplifier path 65 are supplied to a second offset line 61. As already described with reference to FIG. 1, the offset lines 60, 61 mean that the impedances of the amplifier paths 35-40 after the matching networks 53-58 are real and high ohmic at the operating frequency. Accordingly, at the operating frequency, a real image of the power impedance ratio in the transistors of the main amplifier path 64 and of the auxiliary amplifier path 65 is realised.

The output of the first offset line 60, which is connected to the main amplifier path 64, is connected to an impedance inverter 62. This fulfils the same function as the impedance inverter 15 from FIG. 1. The outputs of the impedance inverter 62 and of the second offset line 61 are connected to an output matching network 63. This transforms the impedance into an impedance which is required by further connected processing equipment.

Optionally, the broadband amplifier 30 and the Doherty extension 31 are each structured here as a module. In this manner, the broadband amplifier 30 can be dimensioned with a broad bandwidth without a matching of the offset lines 60, 61 and the impedance inverter 62.

The high-frequency power amplifier optionally also contains a coupling device 33. The coupling device 33 contains a 90°-coupler 67. Accordingly, the coupling device 33 can be coupled directly to the broadband amplifier 30 by a switching device, which is not illustrated here, instead of the Doherty extension 31. The 90°-coupler 67 then couples the two output signals of the broadband amplifier 30 to a common line and supplies the output signal to the output matching network 68. If the auxiliary transistors 48, 50, 52 are also operated in the AB-operating mode, a high-frequency power amplifier operating completely in the AB-operating mode is obtained in this circuit. This option is particularly meaningful if a matching of the offset lines 60, 61 and of the impedance inverter 62 is not possible, for example, for reasons of time. In this case, however, reduced efficiency of the high-frequency power amplifier must be taken into account.

Accordingly, the terminal device is subdivided into two groups each with n transistors. With the use of the Doherty extension 31, one group forms the main amplifier, while the other group forms the auxiliary amplifier. If the coupling device 33 is used, the two groups with the same status can form a conventional terminal device.

Each transistor of the two transistor groups is controlled via 0°-power splitters, and their power, summed via 0°-power combiners, is supplied to the separate outputs. This measure ensures that all terminal-device transistors of one group have the same load impedance according to modulus and phase.

The operating points of the terminal-device groups can be controlled separately from one another by a control device which is not illustrated here. Accordingly, the AB-operating mode is adjusted for the amplifier transistors 47, 49, 51 of the main amplifier path 64, and the C-operating mode is adjusted for the amplifier transistors 48, 50, 52 of the auxiliary amplifier path 65. If the coupling device 33 is used optionally instead of the Doherty extension 31, the AB-operating mode is adjusted for all amplifier transistors 47-52.

If the Doherty extension 31 is used, the 90°-coupler 34 ensures the necessary phase offset, which is generated by the impedance inverter 62. The matching network 63 generates the system load of 25 ohms required for the Doherty system. Furthermore, it provides a broadband load of 50 ohms to further components 32. Optionally, a conventional high-power power combiner can combine several amplifier modules with Doherty extensions as required to form even larger amplifier units.

To reduce the number of matching elements, the offset line 60 can be combined with the impedance inverter 62 to form a common matching element. In this manner, only two matching elements need to be matched within the Doherty extension 31 to the frequency to be used. It is also possible to combine the group outputs of several amplifier modules, once again in each case via separate 0°-power combiners and, for example, to operate 4 broadband amplifiers with one Doherty extension. The disadvantage is that the system bandwidth becomes narrower with an increasing delay time between the Doherty extension and amplifier transistor.

The output matching network 63 or respectively 68 can optionally contain a lightning protection function. Through the optional modular structure of the Doherty extension 31 and the coupling device 33, the broadband amplifier 30 and also further components 32, such as an antenna and/or a filter, can also be dimensioned for broadband without the need to match components to the frequency range used.

Optionally, the Doherty extension 31 can be fitted with offset lines 60, 61 of fixed dimensions and an impedance inverter 62 of fixed dimension. In this case, the Doherty extension is restricted to a fixed frequency range. However, a Doherty extension of this kind is meaningful especially for frequently used frequency ranges.

Furthermore, thermal conditions must be taken into account in setting up the broadband amplifier 30. Since the amplifier transistors 47, 49, 51 of the main amplifier path 64 are constantly in operation and carry a large part of the system load, they also generate the majority of the system waste heat. Accordingly, it is advisable to arrange the amplifier transistors 47, 49, 51 of the main amplifier path 64 on a common cooling element in alternation with the transistors 48, 50, 52 of the auxiliary amplifier path. This distributes the thermal load of the system very uniformly over the cooling element.

If the high-frequency power amplifier is operated only with the Doherty extension 31, the power combiner of the main amplifier path 64, which is not illustrated in FIG. 2, and which draws practically the entire mean output power, should be embodied using stripline technology in such a manner that a meandering metal strip with air as the dielectric is guided along corresponding millings of the cooling element or of the mounting board. The power combiner of the auxiliary amplifier path 65, which is also not illustrated in FIG. 2, generates only a very low thermal power and can therefore be accommodated without difficulty on the printed circuit board, which covers the power combiner of the main amplifier path 64 uniformly.

If the high-frequency power amplifier must also be operated in a classic manner, that is, with the coupling device 33, both power combiners should be embodied using stripline technology in such a manner that a meandering metal strip with air as the dielectric is guided along millings of the cooling element or of the mounting board. In this case, the power combiner of the main amplifier path 64 must also be designed for double the power, and that of the auxiliary amplifier path 65 for the normal power, in classic operating mode.

The 90°-coupler 34 is advantageously built up from three, $\lambda/4$-long coupler structures. A switchable attenuation element upstream of the main amplifier can ensure an asymmetric power distribution which may be necessary for the operating mode with the Doherty extension. In the case of a pure Doherty operating mode, the coupler can, of course, itself be embodied in an asymmetric manner.

The invention is not restricted to the exemplary embodiment presented. All of the features named above or illustrated in the drawings can be advantageously combined with one another within the scope of the invention.

The invention claimed is:

1. A high-frequency power amplifier comprising: a broadband amplifier connected to a Doherty extension and a coupling device via a switching device,
   wherein the broadband amplifier provides a power splitter, a main amplifier path and an auxiliary amplifier path,
   wherein the Doherty extension provides at least one first offset line, a second offset line and an impedance inverter,
   wherein the broadband amplifier amplifies an input signal and supplies the amplified signal to the Doherty extension or to the coupling device, and
   wherein the switching device is configured to switch the broadband amplifier between the Doherty extension and the coupling device.

2. The high-frequency power amplifier according to claim 1, wherein
   the main amplifier path contains at least one amplifier path, and
   the auxiliary amplifier path contains at least one amplifier path.

3. The high-frequency power amplifier according to claim 2, wherein
   the main amplifier path further contains a power splitter, a power combiner and at least two amplifier paths,
   the power splitter is configured to split a power of the main amplifier path between the amplifier paths, and
   the power combiner is configured to combine powers of the amplifier paths.

4. The high-frequency power amplifier according to claim 2, wherein
   the auxiliary amplifier path further contains a power splitter, a power combiner and at least two amplifier paths,
   the power splitter is configured to split the power of the auxiliary amplifier path between the amplifier paths, and
   the power combiner is configured to combine powers of the amplifier paths.

5. The high-frequency power amplifier according to claim 2, wherein
   the amplifier paths each contain at least one first matching network, an amplifier transistor and a second matching network, and
   the first matching network, the amplifier transistor and the second matching network are each connected in series.

6. The high-frequency power amplifier according to claim 5, wherein
   operating points of the amplifier transistors of the amplifier paths of the main amplifier path and operating points of the amplifier transistors of the amplifier paths of the auxiliary amplifier path can be adjusted separately by a control device.

7. The high-frequency power amplifier according to claim 6, wherein
the control device is configured to adjust an operating point of the amplifier transistors of the amplifier paths of the main amplifier path in such a manner that these operate in the AB-operating mode, and
the control device is configured to adjust an operating point of the amplifier transistors of the amplifier paths of the auxiliary amplifier path in such a manner that these operate in the C-operating mode, when the broadband amplifier is configured to supply the amplified signal to the Doherty extension.

8. The high-frequency power amplifier according to claim 6, wherein
the control device is configured to adjust an operating point of the amplifier transistors of the amplifier paths in such a manner that these operate in the AB-operating mode, when the broadband amplifier is configured to supply the amplified signal to the coupling device.

9. The high-frequency power amplifier according claim 1, wherein
the offset lines have adjustable lengths,
the offset lines are configured to adjust an operating frequency of the high-frequency power amplifier, and
the offset lines cause impedances of the amplifier paths after the matching networks to be real and high ohmic at the operating frequency.

10. The high-frequency power amplifier according to claim 1, wherein
the impedance inverter is configured to provide an adjustable operating frequency, and
the impedance inverter is configured to match an impedance of the main amplifier path dependent upon an amplitude of a signal to be amplified.

11. A high-frequency power amplifier comprising:
a broadband amplifier that provides a power splitter, a main amplifier path and an auxiliary amplifier;
a Doherty extension that provides at least one first offset line, a second offset line and an impedance inverter;
a coupling device; and
a switching device configured to switch the broadband amplifier between the Doherty extension and the coupling device, wherein the broadband amplifier amplifies an input signal and supplies the amplified signal to the Doherty extension or to the coupling device via the switching device.

* * * * *